(12) United States Patent
Roesner et al.

(10) Patent No.: US 11,063,014 B2
(45) Date of Patent: Jul. 13, 2021

(54) SEMICONDUCTOR DEVICES INCLUDING A METAL SILICIDE LAYER AND METHODS FOR MANUFACTURING THEREOF

(71) Applicant: Infineon Technologies AG, Neubiberg (DE)

(72) Inventors: Michael Roesner, Villach (AT); Gudrun Stranzl, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/413,195

(22) Filed: May 15, 2019

(65) Prior Publication Data

US 2019/0355691 A1 Nov. 21, 2019

(30) Foreign Application Priority Data

May 16, 2018 (DE) .......................... 102018207651.0

(51) Int. Cl.
*H01L 23/00* (2006.01)
*H01L 29/45* (2006.01)

(52) U.S. Cl.
CPC .............. *H01L 24/30* (2013.01); *H01L 24/27* (2013.01); *H01L 24/29* (2013.01); *H01L 24/32* (2013.01); *H01L 24/33* (2013.01); *H01L 24/83* (2013.01); *H01L 29/456* (2013.01); *H01L 2224/29111* (2013.01); *H01L 2224/29139* (2013.01); *H01L 2224/29166* (2013.01); *H01L 2224/29193* (2013.01); *H01L 2224/30505* (2013.01); *H01L 2224/32245* (2013.01); *H01L 2224/33505* (2013.01); *H01L 2224/83801* (2013.01); *H01L 2924/048* (2013.01); *H01L 2924/0474* (2013.01); *H01L 2924/0475* (2013.01); *H01L 2924/0476* (2013.01); *H01L 2924/0479* (2013.01)

(58) Field of Classification Search
None
See application file for complete search history.

(56) References Cited

U.S. PATENT DOCUMENTS

| 5,217,922 | A | 6/1993 | Akasaki et al. |
| 5,306,950 | A | 4/1994 | Fujikawa et al. |
| 2007/0145546 | A1* | 6/2007 | Lewis ..................... H01L 23/42 |
| | | | 257/675 |
| 2011/0006409 | A1 | 1/2011 | Gruenhagen et al. |
| 2013/0119483 | A1* | 5/2013 | Alptekin ............... H01L 23/485 |
| | | | 257/408 |

FOREIGN PATENT DOCUMENTS

DE 4396525 T1 4/1997

* cited by examiner

Primary Examiner — Alexander G Ghyka
(74) Attorney, Agent, or Firm — Murphy, Bilak & Homiller, PLLC

(57) ABSTRACT

A semiconductor device includes a silicon layer, a metal silicide layer arranged directly on the silicon layer, and a solder layer arranged directly on the metal silicide layer.

9 Claims, 4 Drawing Sheets

SEMICONDUCTOR DEVICES INCLUDING A METAL SILICIDE LAYER AND METHODS FOR MANUFACTURING THEREOF

TECHNICAL FIELD

The present disclosure relates to semiconductor technology. In particular, the present disclosure relates to semiconductor devices including a metal silicide layer and methods for manufacturing thereof.

BACKGROUND

Electrical contacts of semiconductor devices, such as e.g. transistors or diodes, may need to be electrically connected to further components, such as e.g. leadframes or clips. For this purpose, an electrical contact of a semiconductor device may include a metal stack. For example, such metal stack may include stacked layers of titanium, aluminum, nickel-vanadium and gold-tin. Metal stacks including gold-tin may be very costly. In addition, providing electrical connections using such metal stacks may result in mechanical stress that may occur in the semiconductor device after the formation of an electrical connection. Manufacturers of semiconductor devices are constantly striving to improve their products and the methods for manufacturing thereof. It may thus be desirable to develop semiconductor devices and associated manufacturing methods that provide improved and cost-efficient electrical connections between the semiconductor devices and the further components.

SUMMARY

An aspect of the present disclosure relates to a semiconductor device. The semiconductor device comprises a silicon layer. The semiconductor device further comprises a metal silicide layer arranged directly on the silicon layer. The semiconductor device further comprises a solder layer arranged directly on the metal silicide layer.

A further aspect of the present disclosure relates to a method. The method comprises forming a solder layer on a silicon layer, wherein the solder layer comprises a silicide-forming metal. The method further comprises forming a metal silicide layer between the silicon layer and the solder layer, wherein the metal silicide layer is formed from the silicide-forming metal of the solder layer and silicon of the silicon layer.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
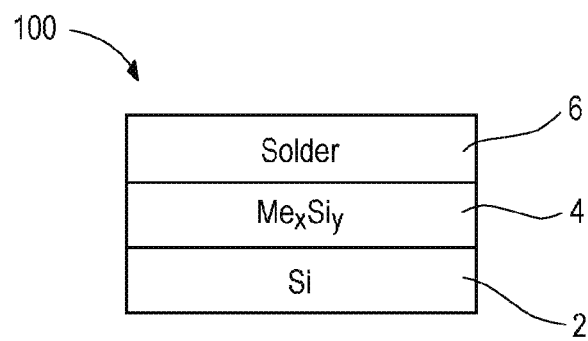
FIG. 1 schematically illustrates a cross-sectional side view of a semiconductor device 100 in accordance with the disclosure.

FIG. 1 schematically illustrates a cross-sectional side view of a semiconductor device 100 in accordance with the disclosure. The semiconductor device 100 is illustrated in a general manner in order to qualitatively specify aspects of the disclosure. The semiconductor device 100 may include further components which are not illustrated in FIG. 1 for the sake of simplicity. For example, the semiconductor device 100 may be extended by any of the aspects described in connection with other devices and methods in accordance with the disclosure.

The semiconductor device 100 includes a silicon layer 2. The semiconductor device 100 further includes a metal silicide layer 4 arranged on the silicon layer 2. In particular, the metal silicide layer 4 is arranged directly on the silicon layer 2. That is, the metal silicide layer 4 is at least partly in contact with the silicon layer 2. The semiconductor device 100 further includes a solder layer 6 arranged on the metal silicide layer 4. In particular, the solder layer 6 is arranged directly on the metal silicide layer 4. That is, the solder layer 6 is at least partly in contact with the metal silicide layer 4.

The silicon layer 2 may be a part of a silicon wafer, a silicon chip or a silicon die. The following comments with regard to wafers may also hold true for chips or dies, and vice versa. The silicon layer 2 may include active device regions of the semiconductor device 100. For example, an active device region may include a channel region of a field effect transistor, a base region of a bipolar transistor, a p/n junction of a diode, etc.

The semiconductor device 100 may be soldered to a metal component (not illustrated in FIG. 1) via the solder layer 6, wherein the metal silicide layer 4 may be at least partly formed during the solder process. In one example, a backside contact of a silicon chip may be soldered to a die pad. In a further example, a frontside contact of a silicon chip may be soldered to a clip. For multiple chips the solder process may be performed as a parallel batch process on the whole wafer area or as sequential chip soldering on each chip frontside or backside.

The solder layer 6 may include an active solder material. In particular, the solder layer 6 may include a tin-silver solder alloy. The solder layer 6 may additionally include a silicide-forming metal and a rare earth metal as will be explained more detailed later on. A thickness of the solder layer 6 may e.g. lie in a range from 20 micrometer to 80 micrometer, more particular from 20 micrometer to 70 micrometer, more particular from 30 micrometer to 80 micrometer, more particular from 30 micrometer to 70 micrometer.

An arrangement in accordance with the disclosure may provide a direct soldering of a frontside and/or a backside of a chip to a metal component without the need of additional costly metallization stacks arranged on the frontside and/or the backside of the chip. In this regard, the frontside of the chip may be specified as the side of the chip at which active device regions may be formed. The metal silicide layer 4 may be electrically conductive. An ohmic contact may be formed between the silicon material of the chip, i.e. the silicon layer 2, and the formed metal silicide layer 4. Accordingly, the use of metallization stacks as electrical contacts may be obsolete. The metal silicide layer 4 may particularly be free from voids and may provide a mechanically stable connection between the chip and the metal component. The solder connection may show reduced mechanical stresses compared to conventional solder connections using metallization stacks. The risk of horizontal chip cracks may thus be significantly reduced. In addition, since no more metallization stacks need to be used for forming electrical connections, a delamination of metallization stacks at edges of the chip and a formation of metal burrs during or after a mechanical dicing may be avoided.

According to an embodiment the solder layer 6 may include a silicide-forming metal corresponding to the metal of the metal silicide layer 4. The silicide-forming metal used for the formation of the metal silicide layer 4 may be provided by silicide-forming metal atoms of the solder layer 6.

According to an embodiment the metal silicide layer 4 may include at least one of titanium silicide, platinum silicide, cobalt silicide, nickel silicide, tungsten silicide, molybdenum silicide, zirconium silicide, and tantalum silicide. Accordingly, the silicide-forming metal of the solder layer 6 may include at least one of titanium, platinum, cobalt, nickel, tungsten, molybdenum, zirconium, and tantalum. More general, the solder layer 6 may include any transition metal which, in combination with silicon, is configured to form a metal silicide. The titanium silicide may include or may consist of e.g. $TiSi_2$ and/or TiSi and/or $Ti_5Si_3$. The platinum silicide may include or may consist of e.g. PtSi. The cobalt silicide may include or may consist of e.g. $Co_2Si$ and/or CoSi and/or $CoSi_2$. The nickel silicide may include or may consist of NiSi and/or $NiSi_2$. The tungsten silicide may include or may consist of e.g. $WSi_2$. The molybdenum silicide may include or may consist of e.g. $MoSi_2$. The zirconium silicide may include or may consist of e.g. $Zr_2Si$. The tantalum silicide may include or may consist of e.g. $TaSi_2$.

According to an embodiment the metal silicide layer 4 may include $Me_xSi_y$, wherein the abbreviation "Me" denotes the metal of the metal silicide layer 4. Here, x may have a value of 1, 2 or 5. In addition, y may have a value of 1, 2 or 3. In one example, the metal may be titanium, i.e. Me=Ti. In this case, the following stable chemical compounds or silicides may be possible: $Ti_5Si_3$ (x=5, y=3); TiSi (x=1, y=1); and $TiSi_2$ (x=1, y=2). In a further example, the metal may be cobalt, i.e. Me=Co. In this case, the following stable chemical compounds or silicides may be possible: $Co_2Si$ (x=2, y=1); CoSi (x=1, y=1); and $CoSi_2$ (x=1, y=2).

According to an embodiment the solder layer 6 may include a rare earth metal. A technical purpose of the rare earth metal during a formation of the metal silicide layer 4 is specified more detailed below.

According to an embodiment the rare earth metal may include at least one of cerium, scandium, lanthanum, praseodymium, promethium, neodymium, samarium, and europium.

According to an embodiment a thickness of the metal silicide layer 4 may lie in a range from 100 nanometer to 1000 nanometer. More particular, the thickness of the metal silicide layer 4 may lie in a range from 100 nanometer to 800 nanometer, more particular from 100 nanometer to 600 nanometer, more particular from 100 nanometer to 400 nanometer, more particular from 100 nanometer to 200 nanometer.

According to an embodiment the semiconductor device 100 may further include an ohmic contact formed between the silicon layer 2 and the metal silicide layer 4. In particular, the ohmic contact may provide an electrical resistance having a linear ohmic electrical performance. The ohmic contact may be formed during a formation of the metal silicide layer 4. Such formation will be specified more detailed later on. Forming the metal silicide layer 4 may be adjusted to form an ohmic contact with a resistance low enough for a desired semiconductor application, such as e.g. a power MOSFET (Metal Oxide Semiconductor Field Effect Transistor), a power IGBT (Insulated Gate Bipolar Transistor), a power diode, or a superjunction power MOSFET.

According to an embodiment the semiconductor device 100 may further include a solder contact (not illustrated in FIG. 1) formed between the solder layer 6 and a metal component (not illustrated in FIG. 1). The metal component may include at least one of a leadframe, a die pad, a lead (or pin), a clip, and a metal foil. The metal component may be manufactured from a metal and/or an associated metal alloy, for example copper, nickel, aluminum, stainless steel, etc. For example, the metal component may be configured to provide an electrical connection between internal circuitry or active device regions of the semiconductor device 100 and external components.

According to an embodiment the silicon layer 2 may be part of a silicon transistor or a silicon diode. In particular, the silicon transistor may be a power MOSFET (Metal Oxide Semiconductor Field Effect Transistor), a power IGBT (Insulated Gate Bipolar Transistor), or a superjunction power MOSFET. In particular, the silicon diode may be a power diode. The active device regions of the transistor or the diode may be formed in the silicon layer 2 of the semiconductor device 100.

Figure 2A:
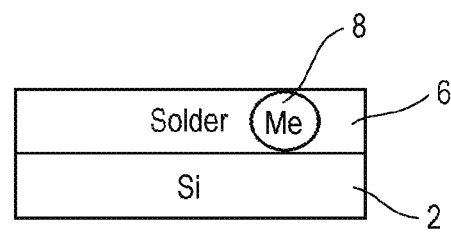
FIGS. 2A to 2B schematically illustrate respective cross-sectional side views of a method for manufacturing a semiconductor device 200 in accordance with the disclosure.
Figure 2B:
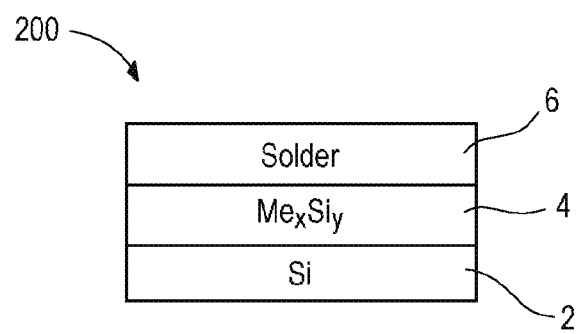

FIGS. 2A to 2B schematically illustrate respective cross-sectional side views of a method for manufacturing a semiconductor device 200 in accordance with the disclosure. The manufactured semiconductor device 200 may be similar to the semiconductor device 100 of FIG. 1. The method of FIGS. 2A to 2B is illustrated in a general manner in order to qualitatively specify aspects of the disclosure. The method may include further aspects which are not illustrated in FIGS. 2A to 2B for the sake of simplicity. For example, the method may be extended by any of the aspects described in connection with other methods and devices in accordance with the disclosure.

In FIG. 2A, a solder layer 6 is formed on a silicon layer 2. The solder layer 6 includes a silicide-forming metal 8.

In FIG. 2B, a metal silicide layer 4 is formed between the silicon layer 2 and the solder layer 6. The metal silicide layer 4 is formed from the silicide-forming metal 8 of the solder layer 6 and silicon of the silicon layer 2.

According to an embodiment the method of FIGS. 2A to 2B may further include an act of forming a solder contact between the solder layer 6 and a metal component (not illustrated in FIGS. 2A to 2B). For example, a silicon wafer or a silicon chip including the silicon layer 2 may be soldered to a metal component via the solder layer 6. The metal component may e.g. be a leadframe, a die pad, a lead (or pin), a clip, or a metal foil.

According to an embodiment the solder contact may be formed in a temperature range from 150° C. to 500° C. More particular the solder contact may be formed in a temperature range from 150° C. to 400° C., more particular from 200° C. to 500° C., more particular from 200° C. to 400° C.

According to an embodiment the metal silicide layer 4 may be at least partly formed by forming the solder contact. During the solder process the metal silicide layer 4 may be at least partly formed from the silicide-forming metal 8 of the solder layer 6 and silicon of the silicon layer 2. Silicide-forming metal atoms of the solder layer 6 may diffuse to a reaction surface and react with silicon of the silicon layer 2 to form the metal silicide layer 4.

According to an embodiment the metal silicide layer 4 may be at least partly formed by forming the solder layer 6 on the silicon layer 2. A part of the metal silicide layer 4 may be formed before forming the solder contact when the solder layer 6 may be applied to the silicon layer 2. Silicide-forming metal atoms 8 in the solder layer 6 may diffuse to a reaction surface between the solder layer 6 and the silicon layer 2 and react with silicon atoms of the silicon layer 2 to form metal silicide molecules.

According to an embodiment the act of forming the solder layer 6 on the silicon layer 2 may include an act of etching a surface of the silicon layer 2. By etching the surface an unevenness or roughness of the surface may be removed such that a smooth surface of the silicon layer 2 may be obtained. An ohmic contact between the silicon layer 2 and the metal silicide layer 4 may be appropriately formed on such smooth surface of the silicon layer 2. In particular, a smooth surface may be obtained by applying a wet chemical etching process. It is to be noted that the metal silicide layer 4 as well as an ohmic contact between the silicon layer 2 and the metal silicide layer 4 may also be formed on a rougher surface. Such rougher surface may e.g. be obtained after the silicon layer 2 may have been thinned by a grinding process. The act of forming the solder layer 6 on the silicon layer 2 may further include an act of forming the solder layer 6 on the etched surface of the silicon layer 2.

According to an embodiment the solder layer 6 may include residual portions of the silicide-forming metal 8 after forming the metal silicide layer 4. The silicide-forming metal 8 of the solder layer 6 may be not entirely used for forming the metal silicide layer 4 such that residual portions of the silicide-forming metal 8 may remain in the solder layer 6. For example, at a point in time when the metal silicide layer 4 may have been formed to a certain extent or thickness, the metal silicide layer 4 may form a barrier which cannot be further passed by atoms of the silicide-forming metal 8. The atoms of the silicide-forming metal 8 may thus no more reach a reaction surface at the silicon layer 2 such that no more metal silicide molecules may be formed from silicon atoms of the silicon layer 2 and silicide-forming atoms 8 of the solder layer 6.

According to an embodiment the solder layer 6 may include a rare earth metal before forming the metal silicide layer 4. The rare earth metal may include at least one of cerium, scandium, lanthanum, praseodymium, promethium, neodymium, samarium, and europium. The radius of the rare earth metal atoms may particularly be smaller than the radius of the metal-silicide forming atoms 8 in the solder layer 6. When forming the metal silicide layer 4 at a reaction surface between the solder layer 6 and the silicon layer 2, the rare earth metal atoms may therefore diffuse to the reaction surface faster than the atoms of the silicide-forming metal 8. At the reaction surface the rare earth metal atoms may react with oxygen (if present) before the silicide-forming metal atoms 8 may reach the reaction surface. Accordingly, the silicide-forming metal atoms 8 reaching the reaction surface may react with silicon of the silicon layer 2 (instead of with oxygen) such that the metal silicide layer 4 may be properly formed. If the amount of rare earth metal atoms in the solder layer 6 is too small, not all of the oxygen may be bound by the rare earth metal. In this case, the formed metal silicide layer 4 may be at least partially oxidized.

According to an embodiment the solder layer 6 may include residual portions of the rare earth metal after forming the metal silicide layer 4. As previously described, the at least partly formed metal silicide layer 4 may form a barrier which may not be passed by certain atom types. Accordingly, the atoms of the rare earth metal may no more reach a reaction surface at the silicon layer 2 such that residual portions of the rare earth metal may remain in the solder layer 6.

According to an embodiment a thickness of the solder layer 6 may lie in a range from 20 micrometer to 80 micrometer before forming the metal silicide layer 4. More particular, the thickness may lie in a range from 20 micrometer to 70 micrometer, more particular from 30 micrometer to 80 micrometer, more particular from 30 micrometer to 70 micrometer.

FIGS. 3A to 3F schematically illustrate respective cross-sectional side views of a method for manufacturing a semiconductor device 300 in accordance with the disclosure. The manufactured semiconductor device 300 may be seen as a more detailed implementation of the semiconductor device 100 of FIG. 1. In addition, the method of FIGS. 3A to 3F may be seen as a more detailed implementation of the method of FIGS. 2A to 2B.

Figure 3A:
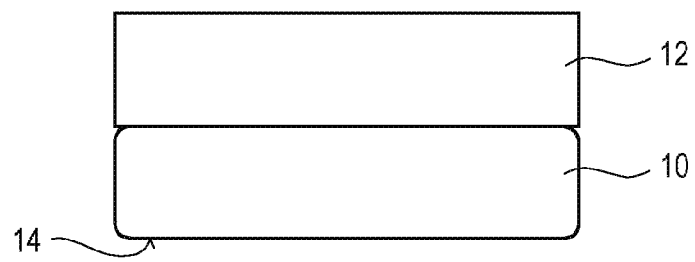
FIGS. 3A to 3F schematically illustrate respective cross-sectional side views of a method for manufacturing a semiconductor device 300 in accordance with the disclosure.

In FIG. 3A, a silicon wafer 10 including a silicon layer may be mounted on a temporary carrier 12. The silicon wafer 10 may include multiple active device regions. In one example, the silicon wafer 10 may be a silicon transistor wafer, i.e. a wafer in which multiple transistor structures may be formed. In a further example, the silicon wafer 10 may be a silicon diode wafer, i.e. a wafer in which multiple diode structures may be formed. The silicon wafer 10 including the multiple device regions may be separated in multiple semiconductor devices later on, for example multiple silicon transistors or multiple silicon diodes.

Figure 3B:
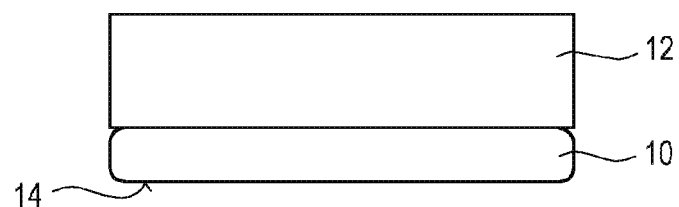

In FIG. 3B, the backside 14 of the silicon wafer 10 may be thinned. In one example, a wet chemical etching process may be applied to the surface of the backside 14. An unevenness or roughness of the backside 14 may thus be removed such that a smooth surface of the silicon wafer 10 may be obtained. An ohmic contact may be appropriately formed on such smooth surface of the silicon wafer 10 later on. In a further example, the silicon wafer 10 may be thinned by applying a grinding process. Here, a rougher surface may be obtained compared to the specified wet chemical etching process. In yet a further example, the thinning of the silicon wafer 10 may include a combination of the described acts, wherein the act of providing a rough surface may be applied first and the act of providing a smooth surface may be applied afterwards.

Figure 3C:
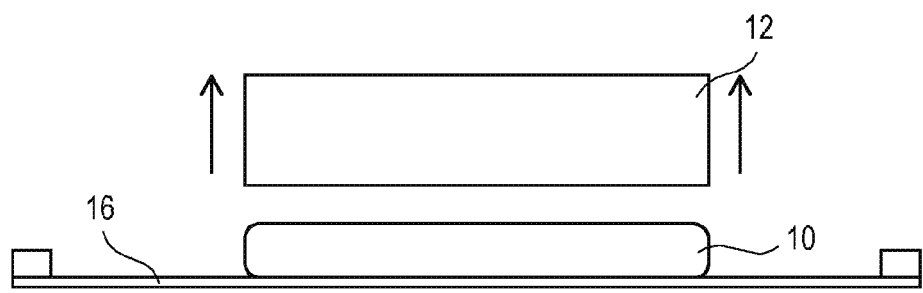

In FIG. 3C, the silicon wafer 10 may be mounted on a tape & frame 16. In addition, the temporary carrier 12 may be removed from the silicon wafer 10 (see arrows).

Figure 3D:
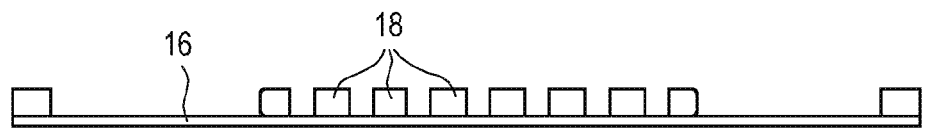

In FIG. 3D, a dicing through the silicon wafer 10 may be performed, wherein the silicon wafer 10 may be separated into multiple silicon chips (or dies) 18. In one example, the silicon chips 18 may be silicon transistor chips. In a further example, the silicon chips 18 may be silicon diode chips. The dicing process of FIG. 3D may correspond to a plasma dicing process, an ultrasonic mechanical dicing process, a laser dicing process, or a combination thereof. A plasma dicing process may include a plasma etching process using $FCl_3$, Ar, $O_2$ and/or $CF_6$ plasma.

Figure 3E:
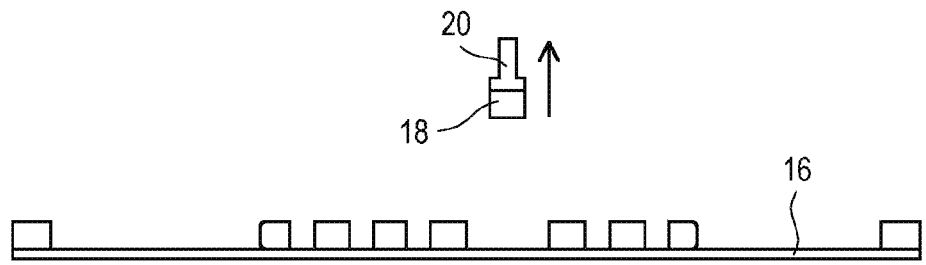

In FIG. 3E, a silicon chip 18 may be picked up from the tape & frame 16 (see arrow) by a pick-up tool 20. For example, the pick-up tool 20 may be or may include a vacuum collet. The act of 3E may be performed in the Backend of a chip manufacturer or a subcontractor.

Figure 3F:
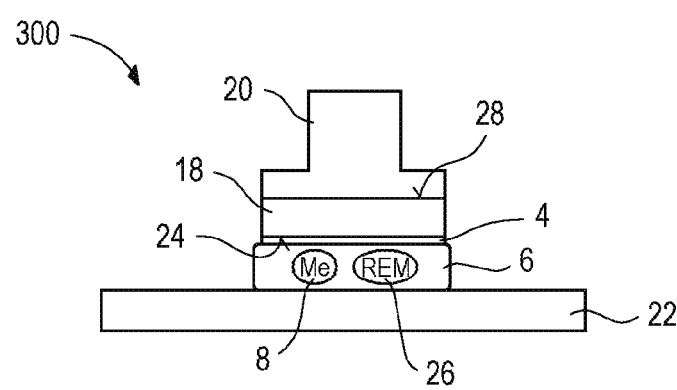

In FIG. 3F, the silicon chip 18 may be attached to a metal component 22. In the example of FIG. 3F, the metal component 22 may be a leadframe which may e.g. be made of copper. In further examples, the metal component 22 may correspond to at least one of a die pad, a lead, a clip, a metal foil. In particular, the backside 24 of the silicon chip 18 may be soldered to the metal component 22 via a solder layer 6. The solder layer 6 may be provided in various ways before the solder process. In a first example, the solder layer 6 may be deposited on the backside 24 of the silicon chip 18. In this regard, the silicon chip 18 optionally may be heated before one or more drops of the solder material may be deposited on the backside 24 of the silicon chip 18. In a second example, the solder layer 6 may be deposited on the surface of the metal component 22 to which the silicon chip 18 is to be soldered. In this regard, the metal component 22 optionally may be heated before one or more drops of the solder material may be deposited on the metal component 22 at the positions where the silicon chip 18 is to be soldered. After the described deposition of the solder material on the backside 24 of the silicon chip 18 and/or on the metal component 22, the silicon chip 18 may be pressed against the metal component 22 with the solder material 6 arranged in between. Note that soldering the silicon chip 18 to the metal component 22 may be performed by additionally pressing the silicon chip 18 against the metal component 22 and/or increasing the temperature at the reaction surface. An additional pressure may e.g. be provided by a weight pressing the silicon chip 18 against the metal component 22.

In the example of FIG. 3F, the solder layer 6 may e.g. include an active tin-silver solder alloy. In addition, the solder layer 6 may include a silicide-forming metal 8 (see "Me") and a rare earth metal 26 (see "REM"). In the example of FIG. 3F, the silicide-forming metal 8 may particularly include titanium. In further examples, the silicide-forming metal 8 may also include another transition metal which, in combination with silicon, is configured to form a metal silicide, such as e.g. at least one of platinum, cobalt, nickel, tungsten, molybdenum, zirconium, tantalum. In the example of FIG. 3F, the rare earth metal 26 may particularly include cerium. In further examples, the rare earth metal 26 may also include at least one of scandium, lanthanum, praseodymium, promethium, neodymium, samarium, and europium.

When soldering the silicon chip 18 to the metal component 22, a metal silicide layer 4 may be at least partly formed between the silicon chip 18 and the solder layer 6. In the example of FIG. 3F, the metal silicide layer 4 may particularly include titanium silicide. The metal silicide layer 4 may be formed from the silicide-forming metal 8 of the solder layer 6 and silicon of the silicon chip 18. It is to be noted that a part of the metal silicide layer 4 may be formed before the solder process when the solder layer 6 may be applied to the backside 24 of the silicon chip 18. The rare earth metal 26 of the solder layer 6 may be configured to react with (ambient) oxygen during the solder process and/or during the application of the solder layer 6 to the silicon chip 18 such that an oxidation of the metal silicide layer 4 may be avoided. During the solder process an ohmic contact may be formed between the silicon material of the silicon chip 18 and the formed metal silicide layer 4. Active device regions of the silicon chip 18 may thus be electrically connected to the metal component 22 via the formed ohmic contact and the electrically conductive metal silicide layer 4.

The method of FIGS. 3A to 3F may include additional acts which are not further specified in detail for the sake of simplicity. For example, a further metal component (not illustrated in FIGS. 3A to 3F) may be attached to e.g. the frontside 28 of the silicon chip 18. In particular, the further metal component may be soldered to the silicon chip 18 via a further solder layer. Similar to the previously described soldering, a further metal silicide layer may be formed between the further solder layer and the silicon chip 18. The further metal component may include at least one of a leadframe, a die pad, a lead, a clip, a metal foil. The act of FIG. 3F may be applied to further silicon chips obtained in the act of FIG. 3E.

Figure 4:
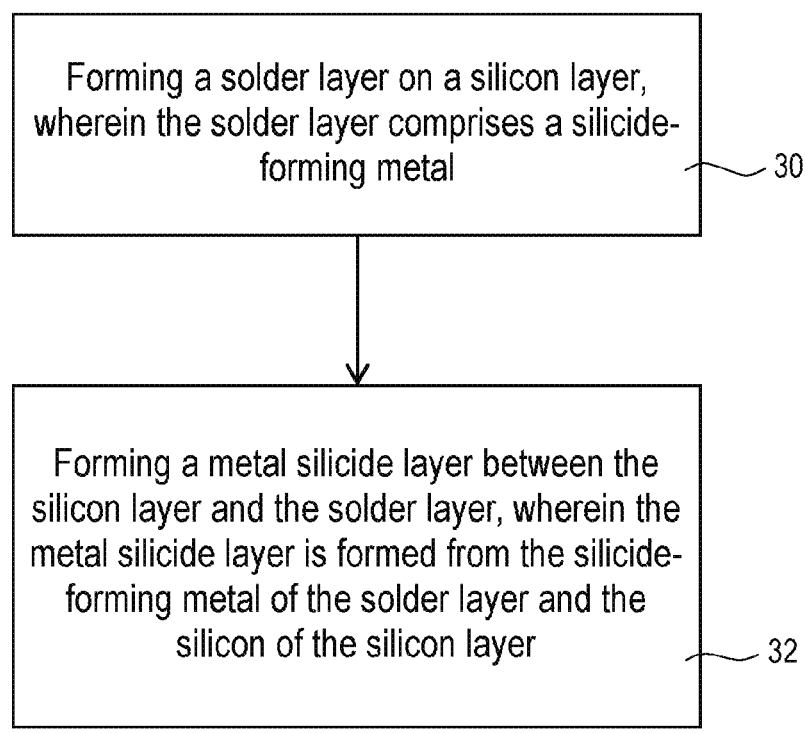
FIG. 4 illustrates a flowchart of a method for manufacturing a semiconductor device in accordance with the disclosure.

FIG. 4 illustrates a flowchart of a method for manufacturing a semiconductor device in accordance with the disclosure. The method may be similar to and may be read in connection with the method of FIGS. 2A to 2B.

At 30, a solder layer is formed on a silicon layer, wherein the solder layer includes a silicide-forming metal. At 32, a metal silicide layer is formed between the silicon layer and the solder layer. The metal silicide layer is formed from the silicide-forming metal of the solder layer and silicon of the silicon layer.

EXAMPLES

In the following, semiconductor devices including a metal silicide layer and methods for manufacturing such semiconductor devices will be explained by means of examples.

Example 1 is a semiconductor device, comprising: a silicon layer; a metal silicide layer arranged directly on the silicon layer; and a solder layer arranged directly on the metal silicide layer.

Example 2 is a semiconductor device according to Example 1, wherein the solder layer comprises a silicide-forming metal corresponding to the metal of the metal silicide layer.

Example 3 is a semiconductor device according to Example 1 or 2, wherein the metal silicide layer comprises at least one of titanium silicide, platinum silicide, cobalt silicide, nickel silicide, tungsten silicide, molybdenum silicide, zirconium silicide, and tantalum silicide.

Example 4 is a semiconductor device according to one of the preceding Examples, wherein the metal silicide layer comprises $Me_xSi_y$, wherein x has a value of 1, 2 or 5, and wherein y has a value of 1, 2 or 3.

Example 5 is a semiconductor device according to one of the preceding Examples, wherein the solder layer comprises a rare earth metal.

Example 6 is a semiconductor device according to Example 5, wherein the rare earth metal comprises at least one of cerium, scandium, lanthanum, praseodymium, promethium, neodymium, samarium, and europium.

Example 7 is a semiconductor device according to one of the preceding Examples, wherein a thickness of the metal silicide layer lies in a range from 100 nanometer to 1000 nanometer.

Example 8 is a semiconductor device according to one of the preceding Examples, further comprising an ohmic contact formed between the silicon layer and the metal silicide layer.

Example 9 is a semiconductor device according to one of the preceding Examples, further comprising a solder contact formed between the solder layer and a metal component, wherein the metal component comprises at least one of a leadframe, a die pad, a lead, a clip, a metal foil.

Example 10 is a semiconductor device according to one of the preceding Examples, wherein the silicon layer is part of a silicon transistor or a silicon diode.

Example 11 is a method, comprising: forming a solder layer on a silicon layer, wherein the solder layer comprises a silicide-forming metal; and forming a metal silicide layer between the silicon layer and the solder layer, wherein the metal silicide layer is formed from the silicide-forming metal of the solder layer and silicon of the silicon layer.

Example 12 is a method according to Example 11, further comprising: forming a solder contact between the solder layer and a metal component.

Example 13 is a method according to Example 12, wherein the solder contact is formed in a temperature range from 150° C. to 500° C.

Example 14 is a method according to one of Examples 12 or 13, wherein the metal silicide layer is at least partly formed by forming the solder contact.

Example 15 is a method according to one of Examples 11 to 14, wherein the metal silicide layer is at least partly formed by forming the solder layer on the silicon layer.

Example 16 is a method according to one of Examples 11 to 15, wherein forming the solder layer on the silicon layer comprises: etching a surface of the silicon layer; and forming the solder layer on the etched surface of the silicon layer.

Example 17 is a method according to one of Examples 11 to 16, wherein the solder layer comprises residual portions of the silicide-forming metal after forming the metal silicide layer.

Example 18 is a method according to one of Examples 11 to 17, wherein the solder layer comprises a rare earth metal before forming the metal silicide layer.

Example 19 is a method according to one of Examples 11 to 18, wherein the solder layer comprises residual portions of the rare earth metal after forming the metal silicide layer.

Example 20 is a method according to one of Examples 11 to 19, wherein a thickness of the solder layer lies in a range from 20 micrometer to 80 micrometer before forming the metal silicide layer.

As employed in this description, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this description and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a silicon layer;
   a metal silicide layer disposed directly on the silicon layer; and
   a solder layer disposed directly on the metal silicide layer, the solder layer comprising a silicide-forming metal which corresponds to the metal of the metal silicide layer,
   wherein the solder layer comprises a tin-silver solder alloy.

2. The semiconductor device of claim 1, wherein the metal silicide layer comprises at least one of titanium silicide, platinum silicide, cobalt silicide, nickel silicide, tungsten silicide, molybdenum silicide, zirconium silicide, and tantalum silicide.

3. The semiconductor device of claim 1, wherein the metal silicide layer comprises $Me_xSi_y$, where x has a value of 1, 2 or 5 and where y has a value of 1, 2 or 3.

4. The semiconductor device of claim 1, wherein the solder layer comprises a rare-earth metal.

5. The semiconductor device of claim 4, wherein the rare-earth metal comprises at least one of cerium, scandium, lanthanum, praseodymium, promethium, neodymium, samarium, and europium.

6. The semiconductor device of claim 1, wherein a thickness of the metal silicide layer is in a range from 100 nanometers to 1000 nanometers.

7. The semiconductor device of claim 1, further comprising:
   an ohmic contact formed between the silicon layer and the metal silicide layer.

8. The semiconductor device of claim 1, further comprising:
   a solder contact formed between the solder layer and a metal component, the metal component comprising at least one of a leadframe, a die pad, a connection lead, a clip, a metal foil.

9. The semiconductor device of claim 1, wherein the silicon layer is part of a silicon transistor or a silicon diode.

* * * * *

UNITED STATES PATENT AND TRADEMARK OFFICE
CERTIFICATE OF CORRECTION

| | |
|---|---|
| PATENT NO. | : 11,063,014 B2 |
| APPLICATION NO. | : 16/413195 |
| DATED | : July 13, 2021 |
| INVENTOR(S) | : M. Roesner et al. |

Page 1 of 1

It is certified that error appears in the above-identified patent and that said Letters Patent is hereby corrected as shown below:

In the Claims

Column 12, Line 17 (Claim 8) please change "clip, a" to -- clip, and a --

Signed and Sealed this
Second Day of November, 2021

Drew Hirshfeld
*Performing the Functions and Duties of the*
*Under Secretary of Commerce for Intellectual Property and*
*Director of the United States Patent and Trademark Office*